US008245902B2

(12) United States Patent
Lee et al.

(10) Patent No.: US 8,245,902 B2
(45) Date of Patent: Aug. 21, 2012

(54) WIRE BONDING APPARATUS AND METHOD USING THE SAME

(75) Inventors: Yong-Je Lee, Asan-si (KR); Seung-Weon Ha, Cheonan-si (KR); Won-Gil Han, Asan-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 13/237,345

(22) Filed: Sep. 20, 2011

(65) Prior Publication Data

US 2012/0111923 A1    May 10, 2012

(30) Foreign Application Priority Data

Nov. 5, 2010    (KR) .................. 10-2010-0109798

(51) Int. Cl.
 *B23K 37/00*    (2006.01)
(52) U.S. Cl. ........................... 228/4.5; 228/9; 228/180.5
(58) Field of Classification Search ........................ None
See application file for complete search history.

(56) References Cited

U.S. PATENT DOCUMENTS

| | | | | |
|---|---|---|---|---|
| 3,894,671 | A * | 7/1975 | Kulicke et al. ................. | 228/4.5 |
| 4,763,827 | A * | 8/1988 | Watanabe et al. .............. | 228/102 |
| 5,059,559 | A * | 10/1991 | Takahashi et al. ............. | 228/105 |
| 5,121,329 | A * | 6/1992 | Crump ........................... | 700/119 |
| 5,504,305 | A * | 4/1996 | Fischer et al. ................. | 219/497 |
| 5,667,129 | A * | 9/1997 | Morita et al. ................. | 228/102 |
| 5,900,106 | A * | 5/1999 | Takahashi et al. ............ | 156/356 |
| 6,320,155 | B1 * | 11/2001 | Barnett ..................... | 219/121.46 |
| 6,494,358 | B2 * | 12/2002 | Narita et al. ..................... | 228/41 |
| 6,730,173 | B2 * | 5/2004 | Miyazawa ..................... | 118/666 |
| 6,814,273 | B2 * | 11/2004 | Sullivan et al. ................ | 228/4.5 |
| 7,427,517 | B2 * | 9/2008 | Okamoto ........................... | 438/6 |
| 2001/0042772 | A1 * | 11/2001 | Narita et al. ..................... | 228/41 |
| 2002/0104870 | A1 * | 8/2002 | Nogawa ........................ | 228/4.5 |
| 2005/0218194 | A1 * | 10/2005 | Suzuki ........................ | 228/180.5 |
| 2009/0004762 | A1 * | 1/2009 | Okamoto ........................... | 438/6 |
| 2011/0226839 | A1 * | 9/2011 | McGlothlan et al. ......... | 228/104 |

FOREIGN PATENT DOCUMENTS

JP    03-090288 A  *  4/1991

(Continued)

*Primary Examiner* — Kiley Stoner
(74) *Attorney, Agent, or Firm* — Muir Patent Consulting, PLLC

(57) ABSTRACT

Provided are a wire bonding apparatus and a method wire bonding and manufacturing a semiconductor device using the same. The wire bonding apparatus includes a heater block configured to support a stack including a chip mounting frame and a plurality of chips stacked on the chip mounting frame. The heater block is configured to supply heat to a first portion of the stack. The apparatus further includes a chip heating unit disposed at a different height from the heater block. The chip heating unit is configured to supply heat to a second portion of the stack at a different height from the first portion. The apparatus further includes a first temperature sensing unit positioned to be located at a first height and to determine a first temperature at the first portion of the stack, a second temperature sensing unit positioned to be located at a second height and to determine a second temperature at the second portion of the stack, and a temperature adjusting unit configured to compare the first temperature to the second temperature and to adjust the magnitude of the heat supplied by at least one of the heater block and the chip heating unit according to a result of the comparison.

27 Claims, 7 Drawing Sheets

FOREIGN PATENT DOCUMENTS

| | | | |
|---|---|---|---|
| JP | 04-023340 A | * | 1/1992 |
| JP | 04-133442 A | * | 5/1992 |
| KR | 10-0289242 | | 5/2001 |
| KR | 10-2006-0034413 A | | 4/2006 |
| KR | 10-2008-0086178 A | | 9/2008 |

* cited by examiner

WIRE BONDING APPARATUS AND METHOD USING THE SAME

CROSS-REFERENCE TO RELATED APPLICATION

This application claims priority from Korean Patent Application No. 10-2010-0109798 filed on Nov. 5, 2010 in the Korean Intellectual Property Office, and all the benefits accruing therefrom under 35 U.S.C. 119, the contents of which in its entirety are herein incorporated by reference.

BACKGROUND OF THE INVENTION

1. Field of the Invention

The present disclosure relates to a wire bonding apparatus and a wire bonding method using the same, and more particularly to a wire bonding apparatus for performing a wire bonding process in a more stable manner by installing a heater block on a chip, and a wire bonding method using the wire bonding apparatus.

2. Description of the Related Art

During a wire bonding process in the manufacture of a semiconductor device, a semiconductor chip and a chip mounting frame, such as a lead frame or a printed circuit board, are coupled to each other using a bonding wire made of, for example, gold, aluminum or copper. A device that performs the wire bonding process may be referred to as a wire bonding apparatus. During the wire bonding process, a pad disposed on a chip may generally be heated using conductive heat generated from a heater block disposed at a lower portion of the wire bonding apparatus.

Depending on the chip characteristic or the structure of a plurality of chips stacked, a temperature of an upper chip may not reach an appropriate level even by the heat applied from the heater block, and the wire bonding process may not be properly performed, deteriorating the reliability of the semiconductor device.

SUMMARY OF THE INVENTION

The disclosed embodiments provide a wire bonding apparatus that can perform a wire bonding process in a stable manner.

The disclosed embodiments also provides a wire bonding method and a method of manufacturing a semiconductor that can perform a wire bonding process in a stable manner.

These and other objects of the disclosed embodiments will be described in or be apparent from the following description.

In one embodiment, a wire bonding apparatus is disclosed. The apparatus includes a heater block for supporting a chip mounting frame disposed thereon, the chip mounting frame having a plurality of chips stacked thereon, and the heater block configured to supply first heat to heat lower portions of the plurality of chips; a chip heating unit configured to be disposed above the chip mounting frame and to supply second heat to heat upper portions of the plurality of chips; a first temperature sensing unit for determining a first temperature of an arbitrary first chip among the plurality of chips; a second temperature sensing unit for determining a second temperature of a second chip disposed farther from the heater block than the first chip; and a temperature adjusting unit configured to compare the first temperature with the second temperature and adjust the magnitude of the second heat generated by the chip heating unit according to the comparison result.

In another embodiment, a wire bonding apparatus is disclosed. The apparatus includes a heater block for supporting a chip mounting frame disposed thereon, the chip mounting frame having a plurality of chips stacked thereon and configured to supply first heat to heat lower portions of the plurality of chips; a chip heating unit configured to be disposed above the chip mounting frame and to supply second heat to heat upper portions of the plurality of chips; a first temperature sensing unit for determining a first temperature of the heater block; a second temperature sensing unit for determining a second temperature of an arbitrary first chip among the plurality of chips; and a temperature adjusting unit configured to compare the first temperature with the second temperature and adjust the magnitude of the second heat generated by the chip heating unit according to the comparison result.

In another embodiment, a wire bonding apparatus is disclosed. The apparatus includes a heater block on which a chip mounting frame having a plurality of chips stacked thereon is to be disposed and that is configured to supply first heat to heat lower portions of the plurality of chips; a chip heating unit disposed above the chip mounting frame and configured to supply second heat to heat upper portions of the plurality of chips; a first temperature sensing unit configured to sense a first temperature of the heater block; a second temperature sensing unit configured to sense a second temperature of a first side of the topmost chip among the plurality of chips, is the topmost chip disposed farthest from the heater block; a third temperature sensing unit configured to sense a third temperature from a second side of the topmost chip; and a temperature adjusting unit configured to compare an average temperature of the second temperature and the third temperature with the first temperature, and adjust the magnitude of the second heat generated by the chip heating unit according to the comparison result.

According to another embodiment, a wire bonding apparatus is disclosed. The apparatus includes a heater block configured to support a stack including a chip mounting frame and a plurality of chips stacked on the chip mounting frame. The heater block is configured to supply heat to a first portion of the stack. The apparatus further includes a chip heating unit disposed at a different height from the heater block. The chip heating unit is configured to supply heat to a second portion of the stack at a different height from the first portion. The apparatus further includes a first temperature sensing unit positioned to be located at a first height and to determine a first temperature at the first portion of the stack, a second temperature sensing unit positioned to be located at a second height and to determine a second temperature at the second portion of the stack, and a temperature adjusting unit configured to compare the first temperature to the second temperature and to adjust the magnitude of the heat supplied by at least one of the heater block and the chip heating unit according to a result of the comparison.

According to another embodiment, a method of manufacturing a semiconductor device is disclosed. The method includes providing a stack of semiconductor chips, providing first heat to the stack using a first heat-providing unit, providing second heat to the stack using a second heat-providing unit, sensing a first temperature within the stack at a first height within the stack, and sensing a second temperature within the stack at a second height within the stack, The second height may be above the first height. The method further includes comparing the first temperature to the second temperature, adjusting the magnitude of one or more of the first heat and the second heat based on the comparison, and connecting bonding wires to chip pads included in the stack of semiconductor chips after adjusting the magnitude of one or more of the first heat and the second heat.

BRIEF DESCRIPTION OF THE DRAWINGS

The above and other features and advantages of the present disclosure will become more apparent by describing in detail various embodiments thereof with reference to the attached drawings in which.

DETAILED DESCRIPTION

Figure 1:
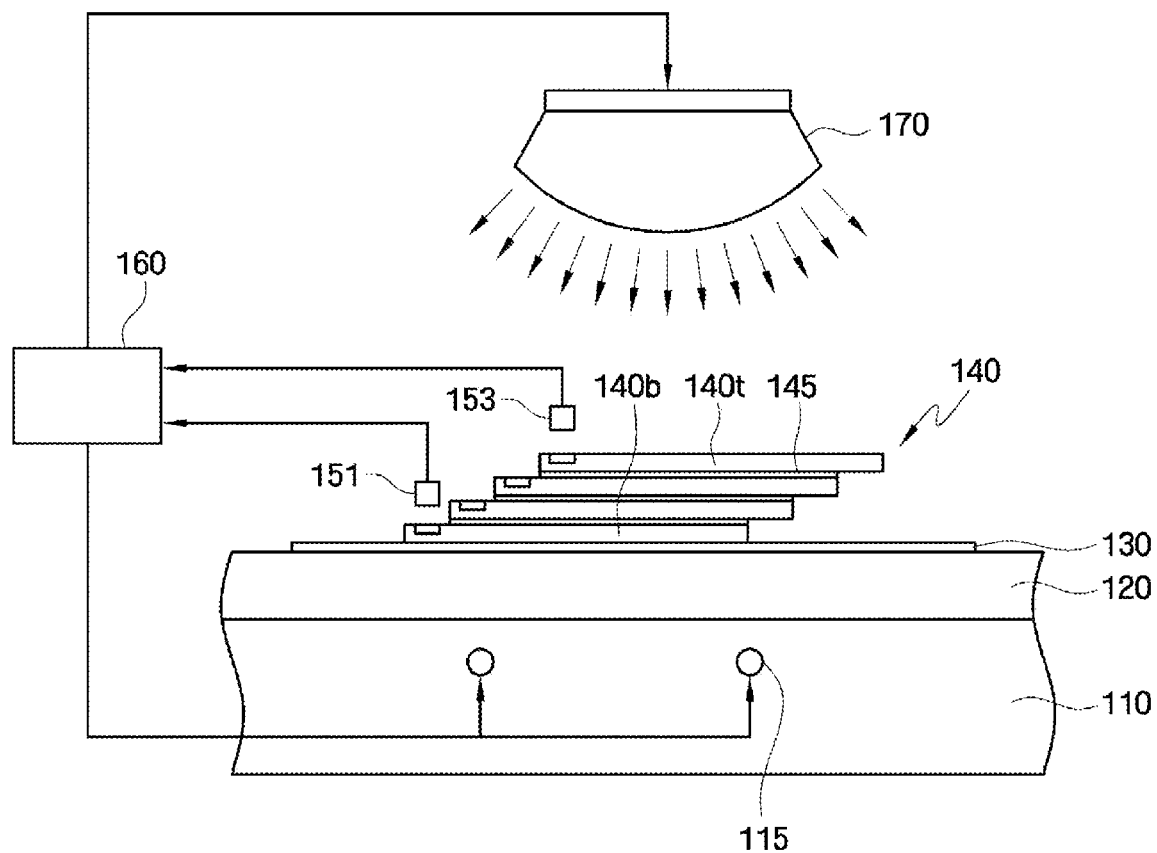
FIG. 1 is a cross-sectional view illustrating a wire bonding apparatus according to an exemplary embodiment and a wire bonding method using the same.

Advantages and features of the present disclosure and methods of accomplishing the disclosed embodiments may be understood more readily by reference to the following detailed description of various embodiments and the accompanying drawings. The present invention may, however, be embodied in many different forms and should not be construed as being limited to the embodiments set forth herein. In the drawings, the thickness of layers and regions are exaggerated for clarity.

As used herein, the term "and/or" includes any and all combinations of one or more of the associated listed items.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises," "includes," and/or "made of," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements or steps, these elements or steps should not be limited by these terms. Unless indicated otherwise, these terms are only used to distinguish one element or step from another element or step. Thus, for example, a first element, a first component or a first section discussed below could be termed a second element, a second component or a second section without departing from the teachings of the present disclosure.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures having schematic properties and shapes of regions shown in figures exemplify specific shapes of regions and elements, but are not intended to limit aspects of the invention.

In the specification, it will be understood that when an element is referred to as being 'on' another element, it can be directly on the other element, or intervening elements may also be present.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, location, shapes, sizes, amounts, or other measures do not necessarily mean an exactly identical orientation, location, shape, size, amount, or other measure, but are intended to encompass nearly identical orientation, location, shapes, sizes, amounts, or other measures within acceptable variations that may occur, for example, due to manufacturing processes.

Unless otherwise defined, all terms (including technical and scientific terms) used herein have the same meaning as commonly understood by one of ordinary skill in the relevant art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, a wire bonding apparatus according to one exemplary embodiment and a wire bonding method using the same will be described with reference to FIG. 1. FIG. 1 is a cross-sectional view illustrating a wire bonding apparatus according to one exemplary embodiment and a wire bonding method using the same.

The wire bonding apparatus according to one embodiment includes a plurality of chips 140, a heater block 120, a chip heating unit 170, a first temperature sensing unit 151, a second temperature sensing unit 153, and a temperature adjusting unit 160.

A chip mounting frame 130 having a plurality of chips 140 stacked thereon may be disposed on the heater block 120. The plurality of chips 140 may include a bottommost chip 140*b* disposed closest to the heater block 120, and a topmost chip 140*t* disposed farthest from the heater block 120. The heater block 120 may comprise a heat-providing unit that includes, for example, a heat-conductive material disposed beneath the plurality of chips 140 and to which heat is specifically applied to assist in a wire bonding process.

As shown, the plurality of chips 140 may be stacked stepwise. For example, the plurality of chips 140 may be arranged such that edges of the plurality of chips 140 are successively exposed, thereby allowing a chip pad of each of the plurality of chips 140 to be sufficiently exposed. Accordingly, a bonding wire may be connected to the chip pad of each of the plurality of chips 140 in a stable manner. In the illustrated embodiment, the plurality of chips 140 are stacked stepwise. However, the plurality of chips 140 may be stacked in various manners according to the purpose of the device used. For example, the plurality of chips 140 may have different shapes and sizes and may be stacked in a stepwise mesa shape. Here, the mesa shape may refer to a shape in which edges of opposing sides are arranged stepwise, respectively. Alternatively, or additionally, chips may be stacked in a zig-zag manner, or a spiral manner, or other ways that permit wire bonding for a plurality of the chips. Some of the chips may be aligned and may not need wire bonding (e.g., some may include through-chip vias for connecting to other chips or to a substrate).

Here, the meaning "being stacked stepwise" encompasses a case in which edges of the plurality of chips are successively exposed to expose a chip pad of each of the plurality of chips, but is not limited to a case in which the plurality of chips are stacked in only one direction. In other words, while the illustrated embodiment shows that the respective chips are arranged to move upwardly to the right by parallel translation, the invention is not limited thereto and the respective chips may be arranged to move to the left by parallel translation or to move to the left and right by parallel translation. Further, two or more sets of the stepwise stacked plurality of chips 140 may be stacked. In other words, when the illustrated stepwise stacked plurality of chips 140 are referred to as a chip set, i.e., a first chip set, another chip set, i.e., a second chip set, may be stacked on the first chip set.

Although only a stack of chips is shown, the stack of chips could be attached, for example, to a package substrate or other substrate. In one embodiment, the chips are semiconductor chips, such as semiconductor memory chips or microprocessor chips. The stack of chips combined with the package substrate maybe referred to as a semiconductor device or a semiconductor package. In addition, though only one stack of chips is shown, the semiconductor device or package could include a plurality of stacks of chips.

As illustrated, the plurality of chips 140 may be stacked by an adhesive layer 145. For example, in one embodiment, the adhesive layer 145 is interposed between each of the plurality of chips 140 sequentially stacked on the chip mounting frame 130, thereby stacking the plurality of chips 140 in a stable manner. The adhesive layer 145 may be made of a material containing a direct attach film, for example, an epoxy based material.

The chip mounting frame 130 may include a package substrate, a lead frame, or a printed circuit board, for example. However, the chip mounting frame 130 is not limited as such.

Although not shown, the wire bonding apparatus may also include a capillary that is used to electrically connect chip pads of the plurality of chips 140 and a connecting pad of the chip mounting frame 130 using a bonding wire. In other words, the capillary may be used to connect an arbitrary one among the plurality of chips 140, i.e., a first chip, to a chip pad of another chip, i.e., a second chip, using a bonding wire. The arbitrary first chip and the second chip may be two chips adjacent to each other, or two chips having at least one chip interposed therebetween.

In addition, the capillary may be used to connect a chip pad of at least one among the plurality of chips 140 to a connecting pad of the chip mounting frame 130 using a bonding wire.

The bonding wire may be a metallic conductive material, for example, gold (Au), which is, however, provided only by way of example, and various materials may be used. In one embodiment, a high-voltage discharge tip that is spaced apart from the capillary may further be used. The high-voltage discharge tip is formed at an end of the bonding wire as a perfectly spherical or substantially spherical ball, thereby allowing the bonding wire to be connected to the bonding pad or the connecting pad in a stable manner.

In one embodiment, a heat-providing unit, such as the heater block 120 provides first heat to heat lower portions of the plurality of chips 140. As illustrated, the heater block 120 may be mounted and fixed on the heater block body portion 110. A heater cartridge 115 that transfers heat to the heater block 120 may be installed in the heater block body portion 110. Accordingly, the heater block body portion 110 is heated by the heater cartridge 115, and heat is transferred from the heater block body portion 110 to the heater block 120. Therefore, a predetermined temperature condition is created on the chip mounting frame 130 having the plurality of chips 140 mounted thereon, thereby facilitating a wire bonding process.

In some other embodiments, the heater block 120 and the heater block body portion 110 may be integrally formed, and thus may referred to together as a heater block. In this case, the heater cartridge 115 may be formed within a functional component having the heater block 120 and the heater block body portion 110 integrally formed therein.

In some other embodiments, in a case where the heater block 120 and the heater block body portion 110 are formed as separable components, the heater block 120 may comprise a plate-shaped structure that may be replaced by one appropriately sized and structured according to the type of a package product. The heater block 120 may be applied by different structures according to the type of semiconductor chip package. Thus, when the type of a package product to be operated is changed, the heater block 120 having a structure suitable to the corresponding package type is installed to be subjected to a wire bonding process for semiconductor chip packages of a variety of products, without needing to replace the combined heater block body portion 110 and plate-shaped heater block 120. In one embodiment, heater block body portion 110 is formed of a first heat-conductive material and plate-shaped heater block 120 is formed of a second heat-conductive material. The first heat-conductive material may be the same as or different from the second heat-conductive material.

Although not shown, a bonding block including a window that opens an operation area of the capillary may further be provided. The bonding block may support the chip mounting frame 130 from upper portions of the heater block 120 through the window that opens an area where the plurality of chips 140 are arranged during a wire bonding process. Thus, the window may be sized to correspond to the plurality of chips 140 arranged on the chip mounting frame 130. In other words, the window may have a size large enough to allow the plurality of chips 140 and the connecting pad (not shown) of the chip mounting frame 130 to be arranged within the window for the capillary to perform the wire bonding process.

In one embodiment, a second heat-providing unit provides second heat to heat upper portions of the plurality of chips 140. For example, in one embodiment, the chip heating unit 170 is disposed above the chip mounting frame 130 and generates second heat to heat upper portions of the plurality of chips 140. As illustrated, the chip heating unit 170 may generate second heat using convection heat. For example, the chip heating unit 170 may generate heat wind having the second heat in the upper portions of the plurality of chips 140. In some other embodiments, the chip heating unit 170 may generate second heat using radiant heat. For example, the chip heating unit 170 may generate infrared rays having second heat in the upper portions of the plurality of chips 140.

Assuming that the heat that is initially generated by the chip heating unit 170 is referred to as an initial second heat, the chip heating unit 170 may determine and supply the initial second heat according to, for example, the number of the plurality of chips 140 stacked on the chip mounting frame 130. The initial second heat may be arbitrarily set by an operator or may be automatically determined by the wire bonding apparatus. The chip heating unit 170 then supplies the initial second heat to the upper portions of the plurality of chips 140, and the magnitude of the initial second heat may be later adjusted by the temperature adjusting unit 160.

In one embodiment, the first temperature sensing unit 151 senses a first temperature of first chip among the plurality of chips 140. The second temperature sensing unit 153 senses a second temperature of a second chip disposed farther from the heater block 120 than the first chip first chip. The first chip and second chip from which to sense temperatures may be arbitrarily selected, for example, by an operator and/or based on equipment for setting the position of temperature sensors. As illustrated in FIG. 1, the first chip may be a bottommost chip 140*b*, and the second chip may be a topmost chip 140*t*. In some other embodiments, a chip positioned higher than the bottommost chip 140*b* may be designated as the first chip, and a chip positioned lower than the topmost chip 140*t* may be designated as the second chip. In the following description, a case in which the first chip is the bottommost chip 140*b*, and the second chip is the topmost chip 140*t* will be described by way of example, but the present disclosure is not limited thereto.

As illustrated, the first temperature sensing unit 151 senses the first temperature of the bottommost chip 140*b*, and the second temperature sensing unit 153 senses the second temperature of the topmost chip 140*t*. For example, the first temperature sensing unit 151 may be configured such that its position is nearest the bottommost chip 140*b* in order to determine the temperature at the bottommost chip 140*b*, and the second temperature sensing unit 153 may be configured such that its position is nearest the topmost chip 140*t* in order to determine the temperature at the topmost chip 140*t*. The first and second temperature sensing units 151 and 153 sense temperatures of the bottommost chip 140*b* and the topmost chip 140*t* in various methods known to one skilled in the art, and may include one or more temperature sensors known in the art.

For example, the temperatures of the bottommost chip 140*b* and the topmost chip 140*t* may be measured by disposing a thermometer close to the bottommost chip 140*b* and the topmost chip 140*t* or allowing a thermometer to contact the bottommost chip 140*b* and the topmost chip 140*t*. Alternatively, the temperatures of the bottommost chip 140*b* and the topmost chip 140*t* may be measured by measuring infrared rays radiated from surfaces of the bottommost chip 140*b* and the topmost chip 140*t*. The temperatures of the bottommost chip 140*b* and the topmost chip 140*t* may also be measured by measuring gas generated when the bottommost chip 140*b* and the topmost chip 140*t* are heated. However, the temperature sensing methods of the bottommost chip 140*b* and the topmost chip 140*t* are not limited to those illustrated herein, and may be performed in various manners.

In the illustrated embodiment of FIG. 1, the temperature sensing units 151 and 153 are disposed on the chip pad. However, the temperature sensing units 151 and 153 may also be disposed close to an area other than the chip pad to measure temperatures of each of the plurality of chips 140. In other words, unlike in the illustrated embodiment, the temperature sensing units 151 and 153 may be disposed in vicinity of surfaces of chips without being disposed near a chip pad to sense the temperature of each chip.

In one embodiment, the temperature adjusting unit 160 compares the first temperature of the bottommost chip 140*b* with the second temperature of the topmost chip 140*t*, and adjusts the magnitude of the second heat generated by the chip heating unit 170 according to the comparison result. In more detail, in one embodiment, the temperature adjusting unit 160 receives first and second temperatures sensed by the first temperature sensing unit 151 and the second temperature sensing unit 153, and compares a temperature difference between the first temperature and the second temperature with a reference value. The temperature adjusting unit 160 increases the magnitude of the second heat generated by the chip heating unit 170 when the temperature difference between the first temperature and the second temperature is greater than the reference value, or maintains the magnitude of the second heat generated by the chip heating unit 170 when the temperature difference is equal to or smaller than the reference value. For example, to compare the temperature difference with the reference value and adjust the magnitude of the second heat, temperature adjusting unit 160 includes circuitry configured to compare temperature values and control the amount of the second heat provided by the chip heating unit 170 (as well as the first heat, as described further below).

In more detail, the first temperature of the bottommost chip 140*b* may be adjusted to maintain a level not greater than a first reference temperature in consideration of the thermal deformability of the chip mounting frame 130. In addition, as illustrated, since the plurality of stacked chips 140 are stacked on the heater block 120, heat loss is caused while the first heat of the heater block 120 supplied to lower portions of the plurality of chips 140 reaches upper portions of plurality of chips 140.

As described above, in order to stack the plurality of chips 140 in a stable manner, the adhesive layer 145 may be interposed between two chips. The first heat generated by the heater block 120 can be sufficiently transferred to the bottommost chip 140*b*, but heat loss is caused when the first heat passes through the adhesive layer 145 and the respective chips. Therefore, it is difficult to sufficiently maintain the heat generated by the heater block 120 as the heat reaches the chips further than the bottommost chip 140*b*, and as the heat eventually reaches the topmost chip 140*t*.

Even when no adhesive layer is interposed, heat may be lost according to the number of stacked chips, such that a smaller amount of heat may be transferred to a chip positioned relatively high, for example, the topmost chip 140*t*, than the bottommost chip 140*b*. Accordingly, based only on the heat supplied by the heater block 120, amounts of heat held in the bottommost chip 140*b* and the topmost chip 140*t* may be different.

In order to achieve a wire bonding process in a stable manner, it is important to maintain surfaces of the plurality of chips 140 at a temperature of a predetermined level or higher. In addition, in order to prevent heat loss from the chip mounting frame 130, the temperature level of the chips 140 should not rise to the predetermined level. Thus, the surface of each of the chips 140 should be maintained at a temperature within a predetermined range. For example, in one embodiment, each chip may be maintained at a temperature in the range of approximately 150±5° C., which is, however, a numeral range provided only by way of example. Each chip may be under various temperature ranges according to, for example, the use, material of the chip, and component materials of a bonding wire.

Therefore, in order to prevent upper chips from decreasing in temperature due to a stacked structure of the plurality of chips 140, the chip heating unit 170 may be disposed on the chip mounting frame 130 to additionally apply heat to the upper portions of the plurality of chips 140. Thus, the plurality of chips 140 disposed at top and bottom portions can obtain stable temperatures for wire bonding by additionally applying heat to the plurality of chips 140.

In other words, in order to achieve stable wire bonding to be performed on the plurality of chips 140, it is important for each of the plurality of chips 140 to be maintained at a temperature in a predetermined range. Therefore, even if the heater block 120 generates first heat from lower portions of the plurality of chips 140, it is quite difficult for the first heat of the heater block 120 to be transferred to the topmost chip 140t among the plurality of chips 140 having a stacked structure. In addition, when the temperature of the heater block 120 is excessively increased, the chip mounting frame 130 having the plurality of chips 140 mounted thereon may be damaged by high temperature. Accordingly, the chip heating unit 170 is disposed on the plurality of chips 140, and temperatures of the plurality of chips 140 are increased to appropriate levels high enough to achieve stable wire bonding by applying second heat to the plurality of chips 140.

Further, the temperature adjusting unit 160 may control the temperature of the heater block 120. In order to prevent the chip mounting frame 130 disposed on the heater block 120 from being damaged by high temperature, the temperature adjusting unit 160 may control the temperature of the heater block 120. In other words, if the first heat generated by the heater block 120 is excessively high, the chip mounting frame 130 exposed to high temperature may be deformed, resulting in the deterioration of device. Therefore, the magnitude of the first heat generated by the heater block 120 may be adjusted based on the first temperature, thereby allowing the chip mounting frame 130 to be maintained at a temperature in a predetermined range. As such, the temperature adjusting unit 160 may adjust the temperature of the heater block 120, the chip heating unit 170, or both, in order to maintain an even temperature at the surfaces of the chips 140 and the chip mounting frame 130, and in order to ensure that the temperature of the chips 140 and the chip mounting frame 130 remain within tolerable levels that do not cause damage to the chips 140 or the chip mounting frame 130.

In more detail, the temperature adjusting unit 160 compares the first temperature recognized by the first temperature sensing unit 151 with a reference temperature, and adjusts the magnitude of first heat generated by the heater block 120 when the temperature difference between the first temperature and the reference temperature is in the predetermined range. For example, in one embodiment, when the temperature of the bottommost chip 140b is in the range of approximately 145° C. to approximately 155° C., the temperature adjusting unit 160 maintains the magnitude of first heat generated by the heater block 120. For example, when the temperature difference between the first temperature and the reference temperature exceeds the above-described range, the temperature adjusting unit 160 may decrease the magnitude of first heat generated by the heater block 120. When the temperature difference between the first temperature and the reference temperature no longer exceeds the above range, the temperature adjusting unit 160 may decrease the magnitude of first heat. However, the above-stated temperature range is provided only by way of example, and the disclosure is not limited to the illustrated range.

As described above, the first temperature may be a temperature of the bottommost chip 140b disposed closest from the heater block 120, and the chip mounting frame 130 may be interposed between the heater block 120 and the bottommost chip 140b. Therefore, the temperatures of the chip mounting frame 130 and the heater block 120 can be estimated based on the first temperature sensed from the bottommost chip 140b.

For example, the chip mounting frame 130 may be disposed in contact with the bottommost chip 140b. Information on the heat transfer rate of the bottommost chip 140b can be obtained in consideration of characteristics of the bottommost chip 140b, including thickness and component materials. Therefore, the temperature of the chip mounting frame 130 can be estimated based on the first temperature sensed from the bottommost chip 140b sensed by the first temperature sensing unit 151. Likewise, the temperature of the heater block 120 may also be estimated based on the first temperature in consideration of characteristics of the chip mounting frame 130, including thickness and component materials.

In other words, the magnitude of the first heat generated by the heater block 120 may be adjusted based on the first temperature sensed from the bottommost chip 140b sensed by the first temperature sensing unit 151, thereby preventing the chip mounting frame 130 disposed on the heater block 120 from being deformed by a high temperature. In addition, since the second heat generated by the chip heating unit 170 may affect the temperature of the bottommost chip 140b, the first heat generated by the heater block 120 is controlled based on the first temperature, thereby preventing the temperature of the bottommost chip 140b from excessively rising.

Therefore, in the wire bonding apparatus according to one embodiment, with respect to the chip mounting frame having the plurality of chips stacked and mounted thereon, a first heat-providing unit (e.g., the heater block) provides lower portions of the plurality of chips with first heat, and a second heat-providing unit (e.g., the chip heating unit) provides upper portions of the plurality of chips with second heat, thereby reducing a temperature difference between the topmost chip and the bottommost chip among the plurality of chips. Accordingly, temperatures of upper chips among the plurality of chips can be maintained in a temperature range in which a wire bonding process can be performed more stably.

According to the embodiments described above, temperatures of the topmost chip and the bottommost chip are sensed, respectively, and temperatures of the chip heating unit and the heater block can be adjusted based on information on the temperatures. In addition, the heater block can be maintained in a predetermined temperature range using the information on the sensed temperatures, thereby preventing the chip mounting frame from being deformed by a high temperature. That is to say, since a stable wire bonding process can be performed, the process yield can be further improved.

Figure 6:
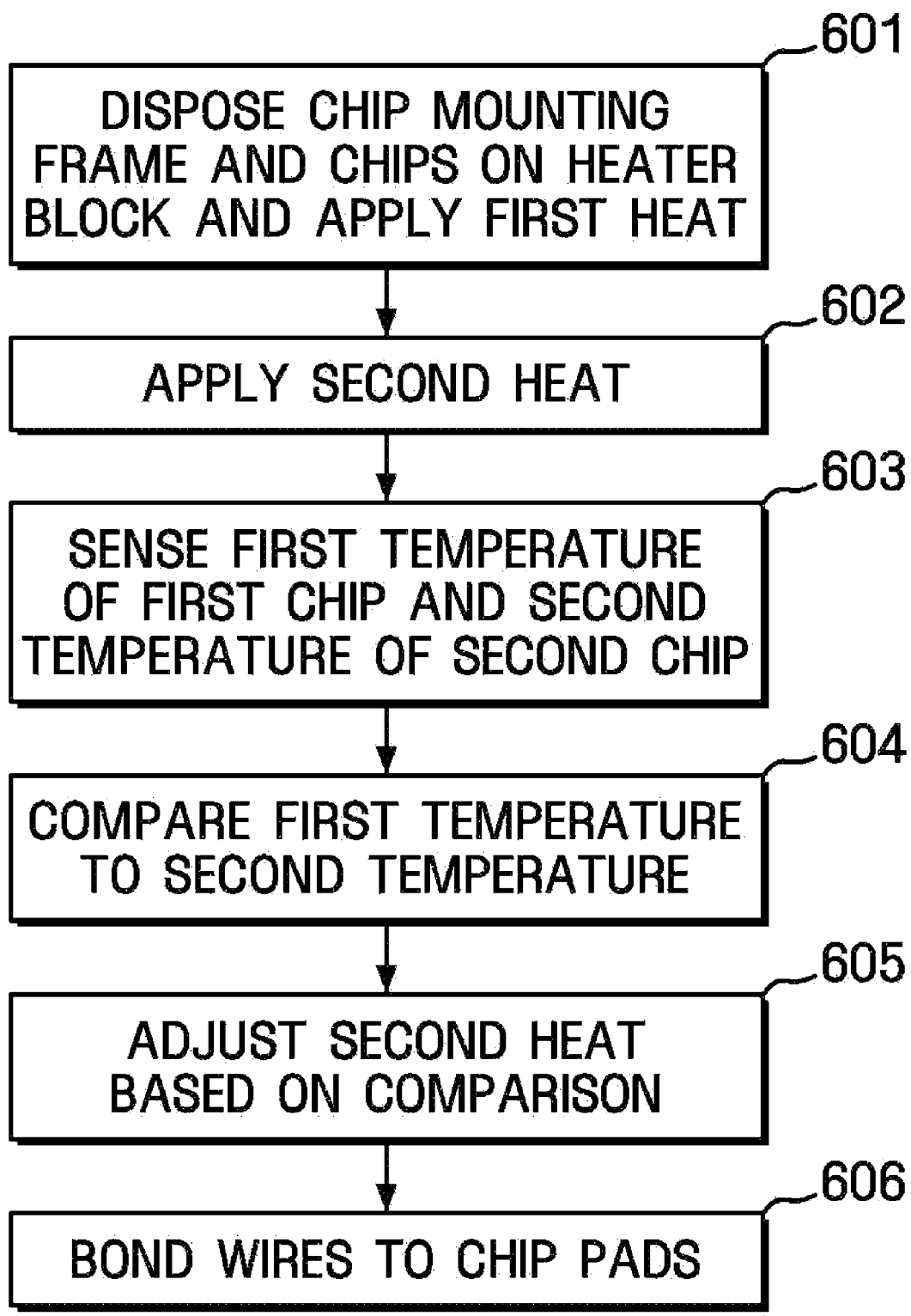
FIG. 6 is a flow chart depicting an exemplary method of wire bonding, according to certain embodiments.

Referring back to FIG. 1, a wire bonding method according to one exemplary embodiment will now be described in more detail, further in connection with FIG. 6. The wire bonding method according to one embodiment may be performed using the wire bonding apparatus described above. Thus, for convenience of explanation, substantially the same contents will be omitted and a brief description will be given.

First, the chip mounting frame 130 having the plurality of chips 140 stacked and mounted is disposed on the heater block 120, and lower portions of the plurality of chips 140 are heated from below using first heat generated by the heater block 120 (step 601). In addition, upper portions of the plurality of chips 140 are heated using second heat generated from above by the chip heating unit 170 disposed on the chip mounting frame 130. Then, a first temperature of the bottommost chip 140b among the plurality of chips 140, disposed closest to the heater block 120, and a second temperature of the topmost chip 140t among the plurality of chips 140, disposed farthest from the heater block 120, are sensed (step 603), and the first temperature and the second temperature are compared with each other (step 604). The magnitude of the second heat generated by the chip heating unit 170 is adjusted according to the comparison result (step 605).

In one embodiment, for the stage of comparing the first temperature with the second temperature, a temperature difference between the first temperature and the second temperature is compared with a reference value. In more detail, when the temperature difference is greater than the reference value such that the temperature of the bottommost chip 140b is greater than the temperature of the topmost chip 140t by more than a predetermined threshold amount, the magnitude of the second heat generated by the chip heating unit 170 may be increased. When the temperature difference is equal to or smaller than the reference value, the magnitude of the second heat may be maintained. In addition, in order to allow the first temperature to be maintained at a predetermined reference temperature or below, the magnitude of the first heat generated by the heater block 120 may be adjusted.

In addition, an initial second heat that is initially generated by the chip heating unit 170 can be determined and set, for example, according to the number of the plurality of chips 140 stacked on the chip mounting frame 130 based on the magnitude of the second heat generated by the chip heating unit 170. Thereafter, the magnitude of the initial second heat may be adjusted according to the result of comparing the first temperature and the second temperature. As described above, the temperature difference between the bottommost chip 140b and the topmost chip 140t can be reduced by adjusting the magnitude of the second heat.

When the first and second heats and the first and second temperatures are at a desirable level, wires may be bonded to chip pads (step 606), wherein wires bonded to chip pads on each of the chips 140 in the stack are bonded using a same or similar temperature (e.g., within 10° C.) to result in similar bonding characteristics.

Figure 2:
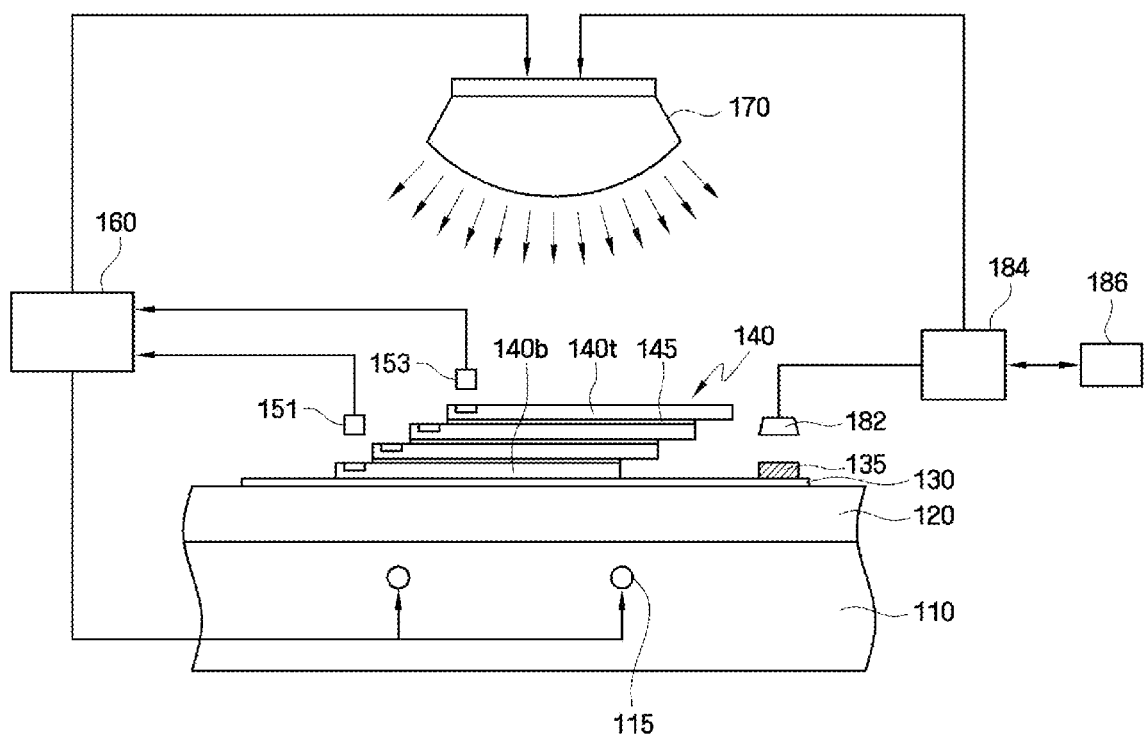
FIG. 2 is a cross-sectional view illustrating a wire bonding apparatus according to another exemplary embodiment and a wire bonding method using the same.

A wire bonding apparatus according to another exemplary embodiment and a wire bonding method using the same will next be described with reference to FIG. 2. FIG. 2 is a cross-sectional view illustrating a wire bonding apparatus according to another exemplary embodiment and a wire bonding method using the same.

The wire bonding apparatus according to the embodiment illustrated in FIG. 2 and the wire bonding method using the same are different from those of the previous embodiment in that a product information supply unit and a product recognizing unit are further provided. For convenience of explanation, the following description will focus on differences between the wire bonding apparatuses and methods according to the illustrated embodiment and the previous embodiment.

As shown in FIG. 2, a product information supply unit 135 which supplies information on characteristics of the plurality of chips 140 may be disposed on the chip mounting frame 130. The information on the characteristics of the plurality of chips 140 may include, for example, information on factors that affect a rate at which the first heat generated by the heater block 120 is transferred from the bottommost chip 140b to the topmost chip 140t, for example, a heat transfer rate. For example, information including, but not limited to, the number of the plurality of chips 140, the thickness and component materials of each chip, heat transfer rate, and so on, may be supplied by product information supply unit 135.

A product recognizing unit 182 recognizes the characteristics of the plurality of chips 140 from the product information supply unit 135. In addition, the temperature determining unit 184 determines an initial second heat initially generated by the chip heating unit 170 according to the characteristics of the plurality of chips 140.

Here, a library 186 in which information on the initial second heat corresponding to the characteristics of the chips may be incorporated in the wire bonding apparatus. The temperature determining unit 184 may include the library 186 in which information on the initial second heat corresponding to the characteristics of the plurality of chips 140 is stored. In the library 186 may be stored information on the magnitude of the second heat suitable to the number of the plurality of chips 140 disposed on the chip mounting frame 130, the thickness and heat transfer rate of each of the plurality of chips 140, or combinations thereof, for example. However, the above-stated information is provided only by way of example, and the information on the magnitude of second heat corresponding to various other factors may also be stored in the library 186.

In the wire bonding apparatus according to the illustrated embodiment of FIG. 2 and the wire bonding method using the same, information on the characteristics of the plurality of chips is supplied to the wire bonding apparatus using the product information supply unit and the product recognizing unit, thereby automatically determining the initial second heat that is initially supplied by the chip heating unit. Accordingly, it is not necessary for an operator to determine the initial second heat in person or to input the initial second heat into the wire bonding apparatus separately, thereby rapidly performing the wire bonding process.

In addition, the product information supply unit 135 may be installed at each chip mounting frame having the plurality of chips mounted thereon. Alternatively, a plurality of chip mounting frames may have a single product information supply unit installed therefor. In other words, the second heat dependent on characteristics of the plurality of chips may be generated even if the chips stacked on neighboring sets of chips have different characteristics by installing information supply units at individual chip mounting frames having the plurality of chips mounted thereon, respectively, the information supply units having information on the corresponding plurality of chips.

Alternatively, a single product information supply unit may be provided for several sets of a plurality of chips. In such a case, the characteristics of the plurality of chips stacked in each set of the plurality of chips may be substantially the same as each other.

The product information supply unit 135 and the product recognizing unit 182 may be implemented with known technology for storing data and reading data from hardware, such as visual recognition, radio frequency sensing, a physical wired connection, etc.

Figure 3:
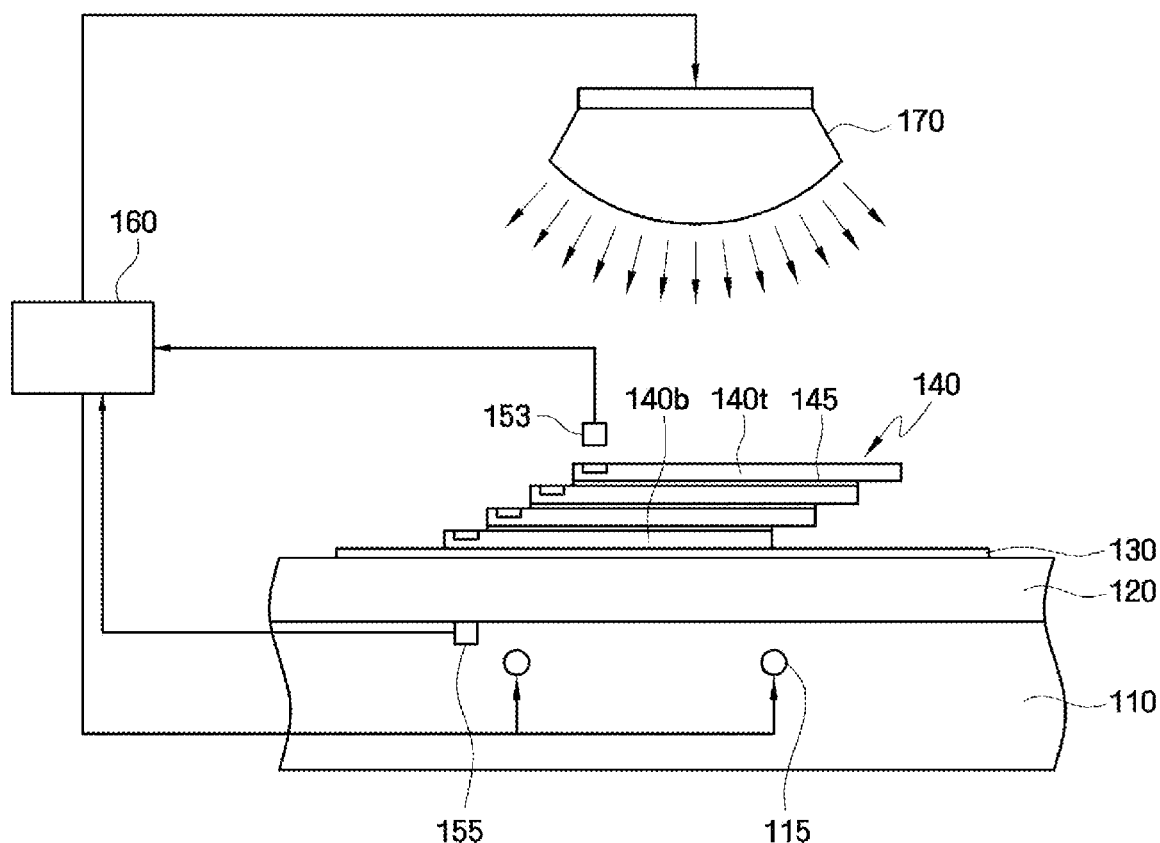
FIG. 3 is a cross-sectional view illustrating a wire bonding apparatus according to still another exemplary embodiment and a wire bonding method using the same.

A wire bonding apparatus according to still another embodiment and a wire bonding method using the same will next be described with reference to FIG. 3. FIG. 3 is a cross-sectional view illustrating an exemplary wire bonding apparatus according to still another embodiment and a wire bonding method using the same.

The wire bonding apparatus according to the illustrated embodiment of FIG. 3 and the wire bonding method using the same are different from those of the previous embodiments in that a temperature of a heater block and a temperature of a topmost chip are compared and the magnitude of second heat supplied from a chip heating unit is adjusted. For convenience of explanation, the following description will focus on differences therebetween and a detailed description thereof will not be given or will be briefly made.

Referring to FIG. 3, the wire bonding apparatus according to the illustrated embodiment includes a chip mounting frame 130 having a plurality of chips 140 stacked and mounted, a heater block 120 which generates first heat to heat lower portions of the plurality of chips 140, and a chip heating unit 170 disposed on the chip mounting frame 130 and generating second heat to heat upper portion of the plurality of chips 14. The first temperature sensing unit 155 senses a first temperature of the heater block 120, and the second temperature sensing unit 153 senses a second temperature of an arbitrary first chip among the plurality of chips. The temperature adjusting unit 160 compares the first temperature with the second temperature, and adjusts the magnitude of the second heat generated by the chip heating unit 170 according to the comparison result. Here, the second temperature sensing unit 153 may sense a temperature of a chip positioned relatively high, among the plurality of chips 140. For example, the second temperature sensing unit 153 may sense a temperature of the topmost chip 140$t$ disposed farthest from the heater block 120. In the following description, a case where the second temperature sensing unit 153 senses the temperature of the topmost chip 140$t$ will be described by way of example. However, the present disclosure is not limited to the illustrated embodiment, and the second temperature sensing unit 153 may sense a temperature of a chip positioned lower than the topmost chip 140$t$.

In more detail, the first temperature sensing unit 155 senses a temperature of the heater block 120. The temperature of the bottommost chip 140$b$ can be estimated based on the temperature of the heater block in consideration of the thickness and heat transfer rate of the chip mounting frame 130 and the thickness and heat transfer rate of the bottommost chip 140$b$. Depending on the thickness and heat transfer rate of the chip mounting frame 130, it may be assumed that the temperature of the bottommost chip 140$b$ is substantially the same as the temperature of the heater block 120.

In some other embodiments, there may be a temperature difference between the heater block 120 and the bottommost chip 140$b$ due to the thicknesses and heat transfer rates of the chip mounting frame 130 and bottommost chip 140$b$. However, in consideration of relative proximity between the heater block 120 and the bottommost chip 140$b$, it is possible to estimate the temperature of the bottommost chip 140$b$ based on the temperature of the heater block 120. Therefore, in one embodiment, the temperature of the bottommost chip 140$b$ is estimated, and the temperature of the heater block 120 is then determined.

In one embodiment, the temperature of the heater block 120 is measured by contacting a bottom surface of the heater block 120 mechanically. For example, a heater block temperature sensor, as disclosed in Korean Patent Publication No. 10-2006-0034413, may be employed to measure the temperature of the heater block 120. However, this is provided only by way of example, and the present disclosure is not limited thereto. The temperature of the heater block 120 may be measured in various manners.

The temperature adjusting unit 160 compares a first temperature sensed by the first temperature sensing unit 155 with a first reference temperature, and adjusts the magnitude of the first heat generated by the heater block 120. In addition, the temperature adjusting unit 160 compares a temperature difference between the first temperature of the heater block 120 and the second temperature of the topmost chip 140$t$ with a reference value, and adjusts the magnitude of the second heat according to the comparison result.

In more detail, in one embodiment, the temperature adjusting unit 160 increases the magnitude of the second heat when the temperature difference is greater than the reference value, or maintains the magnitude of the second heat when the temperature difference is equal to or smaller than the reference value. As described above, the temperature adjusting unit 160 can reduce the temperature difference between the bottommost chip 140$b$ and the topmost chip 140$t$ by adjusting the magnitude of the second heat.

Like in the above-described embodiments, the initial second heat that is initially generated by the chip heating unit 170 can be determined according to, for example, the number of the plurality of chips 140 stacked on the chip mounting frame 130.

In the wire bonding apparatus according to the illustrated embodiment of FIG. 3 and the wire bonding method using the same, the temperature of the bottommost chip 140$b$ can be advantageously estimated more easily by measuring the temperature of the heater block 120, rather than by measuring the temperature of the bottommost chip 140$b$. In addition, as described in the previous embodiment, the chip heating unit 170 supplies upper portions of the plurality of chips 140 with second heat, thereby allowing a temperature in which a wire bonding process is performed to be maintained in a stable manner until the wire bonding process is performed on the topmost chip 140$t$. Further, the temperature adjusting unit may prevent excessive heat from being applied to the plurality of chips by adjusting first heat of the heater block and second heat of the chip heating unit, thereby achieving a much more stable wire bonding process.

Figure 4:
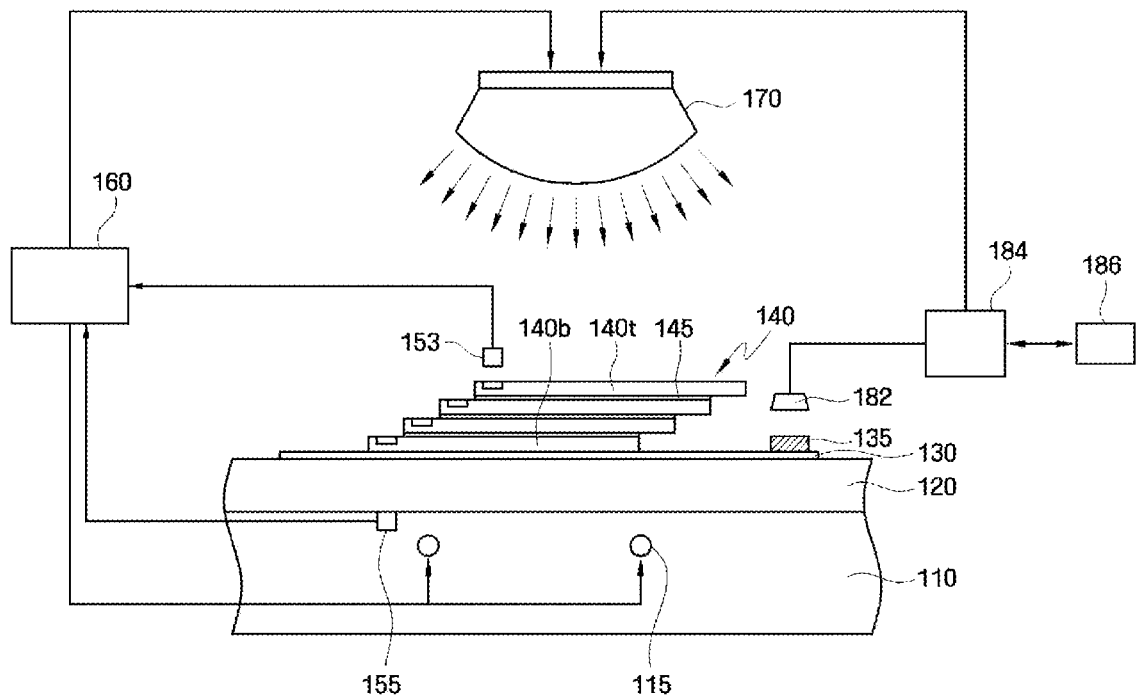
FIG. 4 is a cross-sectional view illustrating a wire bonding apparatus according to a further exemplary embodiment and a wire bonding method using the same.

Hereinafter, a wire bonding apparatus according to still another exemplary embodiment and a wire bonding method using the same will be described with reference to FIG. 4. FIG. 4 is a cross-sectional view illustrating a wire bonding apparatus according to a further exemplary embodiment and a wire bonding method using the same.

The wire bonding apparatus according to the illustrated embodiment of FIG. 4 and the wire bonding method using the same are different from those of the previous embodiments in that a first temperature sensing unit sensing the temperature of a heater block and a second temperature sensing unit sensing the temperature of a topmost chip are provided and a product information supply unit and a product recognizing unit are further provided.

As shown in FIG. 4, the wire bonding apparatus according to the illustrated embodiment includes a product information supply unit 135 disposed on the chip mounting frame 130, and a product recognizing unit 182 recognizing information on characteristics of the plurality of chips 140 from the product information supply unit 135. In addition, the temperature determining unit 184 may determine an initial second heat initially generated by the chip heating unit 170 according to the characteristics of the plurality of chips 140.

Here, the temperature determining unit 184 may incorporate a library 186 in which information on the magnitude of the second heat suitable to the characteristics of the plurality of chips 140 is stored. As such, a library 186 in which information on the initial second heat corresponding to the characteristics of the chips 140 may be incorporated in the wire bonding apparatus. In the library 186 may be stored information on the magnitude of the second heat suitable to the number of the plurality of chips 140 disposed on the chip mounting frame 130, the thickness and heat transfer rate of each of the plurality of chips 140, or combinations thereof, for example. However, the above-stated information is provided only by way of example, and the information on the magnitude of second heat corresponding to various additional factors may also be stored in the library 186.

In the wire bonding apparatus according to the illustrated embodiment of FIG. 4 and the wire bonding method using the same, the temperature of the bottommost chip 140*b* can be advantageously estimated more easily by measuring the temperature of the heater block 120, rather than by measuring the temperature of the bottommost chip 140*b*. In addition, in the wire bonding apparatus according to the embodiment of FIG. 4 and the wire bonding method using the same, as described above, the chip heating unit 170 supplies upper portions of the plurality of chips 140 with second heat, thereby allowing a temperature in which a wire bonding process is performed to be maintained in a stable manner until the wire bonding process is performed on the topmost chip 140*t*. Further, the temperature adjusting unit may prevent excessive heat from being applied to the plurality of chips 140 by adjusting first heat of the heater block and second heat of the chip heating unit, thereby achieving a much more stable wire bonding process.

Furthermore, the information on the characteristics of the plurality of chips is supplied to the wire bonding apparatus using the product information supply unit and the product recognizing unit, thereby automatically determining the initial second heat that is initially supplied by the chip heating unit. Accordingly, it is not necessary for an operator to determine the initial second heat in person or to input the initial second heat into the wire bonding apparatus separately, thereby rapidly performing the wire bonding process.

In addition, as described above, the product information supply unit 135 may be installed at each chip mounting frame having the plurality of chips mounted thereon. Alternatively, a plurality of chip mounting frames may have a single product information supply unit installed therefor.

Figure 5:
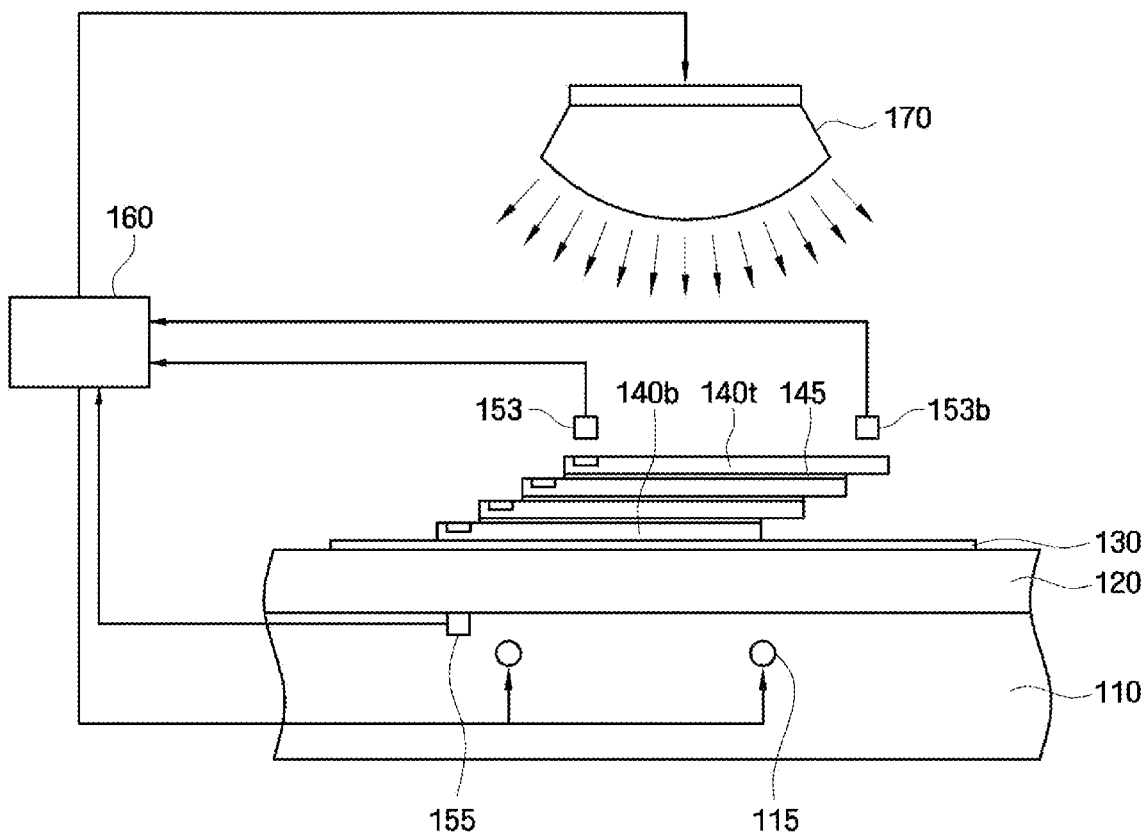
FIG. 5 is a cross-sectional view illustrating a wire bonding apparatus according to yet another exemplary embodiment and a wire bonding method using the same.

Next, a wire bonding apparatus according to still another exemplary embodiment and a wire bonding method using the same will be described with reference to FIG. 5. FIG. 5 is a cross-sectional view illustrating a wire bonding apparatus according to yet another exemplary embodiment and a wire bonding method using the same.

The wire bonding apparatus according to the illustrated embodiment of FIG. 5 and the wire bonding method using the same are different from those of the previous embodiments in that temperatures of one and the other sides of a topmost chip are measured to obtain an average temperature thereof, and the magnitude of second heat supplied from a chip heating unit is adjusted using the average temperature. The following description will focus on differences between the wire bonding apparatuses and methods according to the illustrated embodiment and the previous embodiments.

Referring to FIG. 5, a chip mounting frame 130 having a plurality of chips 140 stacked and mounted thereon is disposed on a heater block 120, and the heater block 120 generates first heat to heat lower portions of the plurality of chips 140. A chip heating unit 170 is disposed on the chip mounting frame 130 and generates second heat to heat upper portions of the plurality of chips 140. A first temperature sensing unit 155 senses a first temperature of the heater block 120, and a second temperature sensing unit 153 senses a second temperature at one side of a topmost chip 140*t*, a third temperature sensing unit 154 senses a third temperature at the other side of the topmost chip 140*t*. The temperature adjusting unit 160 compares an average temperature of the second temperature and the third temperature with a first temperature, and adjusts the magnitude of the second heat generated by the chip heating unit 170 according to the comparison result.

As described above, the plurality of chips 140 are stacked by an adhesive layer 145, and there may be a heat loss due to the respective chips 140 and the adhesive layer 145 interposed therebetween while the first heat generated by the heater block 120 reaches the topmost chip 140*t*. Accordingly, the chip heating unit 170 supplies the upper portions of the plurality of chips 140 with the second heat, thereby allowing the topmost chip 140*t* to be maintained at an appropriate temperature in which wire bonding is stably achieved. In the embodiment of FIG. 5, the temperatures of the one and the other sides of the topmost chip 140*t* are sensed, and the average temperature thereof is compared with the first temperature. Thus, a temperature difference, which may be created within the topmost chip 140*t* itself, can be taken into consideration.

In more detail, the temperature adjusting unit 160 compares the first temperature of the heater block 120 with a first reference temperature, and adjusts the magnitude of first heat generated by the heater block 120, thereby allowing the bottommost chip 140*b* to be maintained at a predetermined temperature, while preventing the chip mounting frame 130 from being deformed. In addition, the temperature adjusting unit 160 compares the first temperature with an average temperature of the second temperature and the third temperature. That is to say, the temperature adjusting unit 160 compares a temperature difference between the first temperature and the average temperature with a reference value. When the temperature difference is greater than the reference value, the temperature adjusting unit 160 increases the magnitude of the second heat generated by the topmost chip 140*t*, and when the temperature difference is equal to or smaller than the reference value, the temperature adjusting unit 160 maintains the magnitude of the second heat. Accordingly, the plurality of chips 140 can be maintained at an appropriate temperature in which a stable wire bonding process can be performed while reducing the temperature difference between the topmost chip 140*t* and the bottommost chip 140*b*.

In addition, wire bonding apparatuses according to some other embodiments, although not shown, may further include a product information supply unit disposed on the chip mounting frame 130 of the wire bonding apparatus according to the illustrated embodiment, as shown in FIG. 5, and supplying information on characteristics of the plurality of chips, and a product recognizing unit recognizing characteristics of the plurality of chips from the product information supply unit. Also, alternatively, the first temperature sensing unit 155 may sense the temperature of one of the bottom chips in the stack, such as the bottommost chip 140*b* directly, rather than estimating such a temperature, as described above in connection with certain embodiments. As such, various aspects of the different embodiments described above may be combined without departing from the spirit and scope of the present disclosure.

The method and apparatus described above may be used for different types of chips that use wire bonding, such as, for example, semiconductor memory chips, microprocessor chips, etc. In addition, the chips can be part of a package, a package-on-package device, a module (e.g., memory module), can be disposed directly on a printed circuit board (PCB) during the wire bonding process, etc.

Figure 7:
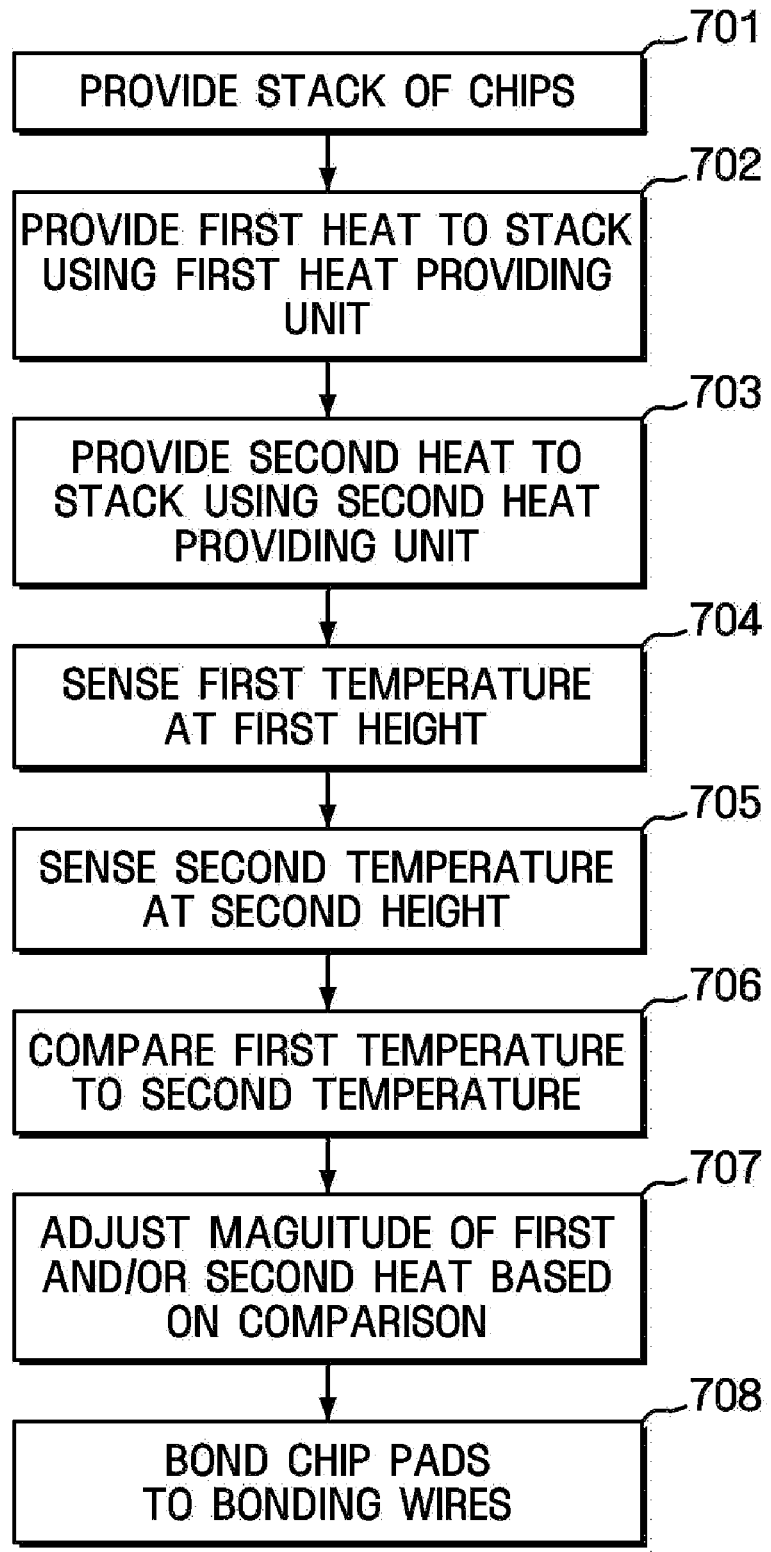
FIG. 7 is a flow chart depicting an exemplary method of manufacturing a semiconductor device, according to certain embodiments.

A method of manufacturing a semiconductor device using a wire bonding apparatus according to certain exemplary embodiments will now be described in connection with FIG. 7.

In step 701, a stack of chips, such as semiconductor memory chips, is provided. The stack may include a plurality of chips arranged in one of different stacked arrangements.

The stack may include adhesive layers connecting the chips, and may include various inter-chip connections, such as through vias, passing through the chips. In one embodiment, the chips include chip pads that are to be used for wire bonding to chip pads of other chips or to other terminals, such as terminals on a package substrate or PCB.

In step 702, first heat is provided to the stack using a first heat-providing unit. For example, in one embodiment, the first heat-providing unit is a heater block positioned below the stack of chips, such as described in the above embodiments. However, other types of heat-providing units may be used. In step 703, second heat is provided to the stack using a second heat-providing unit. For example, in one example, the second heat-providing unit is a convection or radiating heating unit such as described in the above embodiments. However, other types of heat-providing units may be used.

In step 704, a first temperature within the stack at a first height within the stack is sensed. For example, the first temperature may be the temperature of a heating block or a chip near the bottom of the stack, as described in the embodiments above.

In step 705, a second temperature within the stack at a second height within the stack is sensed, wherein the second height is different from the first height. For example, the second height may be above the first height and the second temperature may be the temperature of a chip near the top of the stack, as described in the embodiments above.

In step 706, the first temperature to the second temperature are compared. For example, the temperatures may be compared by circuitry configured to determine a temperature difference between two sensed temperatures.

In step 707, the magnitude of one or more of the first heat and the second heat are adjusted based on the comparison. For example, in one embodiment, a magnitude of the second heat is increased if the first temperature is determined to be greater than the second temperature by more than a threshold amount, as described in some of the embodiments above. However, other magnitudes may be adjusted in order to ensure that the temperatures of the top chips and the bottom chips are substantially the same during the wire bonding procedure. For example, the first heat may be raised or lowered, and/or the second heat may be raised or lowered, to achieve a stable environment for wire bonding.

In step 708, bonding wires are bonded to chip pads included in the stack of semiconductor chips after adjusting the magnitude of one or more of the first heat and the second heat. As such, using the process described above, the temperatures used to bond the different wires to different chips are nearly the same, resulting in wire bonding throughout the chips and the chip mounting frame that maintains similar physical and electrical characteristics.

While the present disclosure has been particularly shown and described with reference to exemplary embodiments, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A wire bonding apparatus comprising:
    a heater block for supporting a chip mounting frame disposed thereon, the chip mounting frame having a plurality of chips stacked thereon, and the heater block configured to supply first heat to heat lower portions of the plurality of chips;
    a chip heating unit configured to be disposed above the chip mounting frame and to supply second heat to heat upper portions of the plurality of chips;
    a first temperature sensing unit for determining a first temperature of an arbitrary first chip among the plurality of chips;
    a second temperature sensing unit for determining a second temperature of a second chip disposed farther from the heater block than the first chip;
    a temperature adjusting unit configured to compare the first temperature with the second temperature and adjust the magnitude of the second heat generated by the chip heating unit according to the comparison result; and
    a capillary configured to connect bonding wires to chip pads of the chips.

2. The wire bonding apparatus of claim 1, wherein the plurality of chips include chips stacked vertically, wherein adjacent chips of the stack are connected to each other by an adhesive layer.

3. The wire bonding apparatus of claim 1, wherein the temperature adjusting unit is configured to compare a temperature difference between the first temperature and the second temperature with a reference value, and increase the magnitude of the second heat when the temperature difference is greater than the reference value, or maintain the magnitude of the second heat when the temperature difference is equal to or smaller than the reference value.

4. The wire bonding apparatus of claim 3, wherein the temperature adjusting unit is configured to compare the first temperature with a first reference temperature and based on the comparison adjust the magnitude of the first heat generated by the heater block.

5. The wire bonding apparatus of claim 1, further comprising a temperature determining unit configured to determine an initial second heat initially generated by the chip heating unit according to the number of the plurality of chips stacked on the chip mounting frame.

6. The wire bonding apparatus of claim 1, further comprising:
    a product information supply unit disposed on the chip mounting frame and configured to supply information on characteristics of the plurality of chips; and
    a product recognizing unit configured to recognize characteristics of the plurality of chips from the product information supply unit when the chip mounting frame moves into the wire bonding apparatus,
    wherein the chip mounting frame further comprises a temperature determining unit configured to determine an initial second heat initially generated by the chip heating unit according to the characteristics of the plurality of chips recognized by the product recognizing unit.

7. The wire bonding apparatus of claim 6, wherein the temperature determining unit includes a library in which information on the initial second heat corresponding to the characteristics of the plurality of chips is stored.

8. The wire bonding apparatus of claim 6, wherein the characteristics of the plurality of chips include a heat transfer rate of the first heat from a bottommost chip of the plurality of chips to the topmost chip of the plurality of chips.

9. The wire bonding apparatus of claim 1, wherein a temperature sensed by the first temperature sensing unit is used to estimate the first temperature using the characteristics of the plurality of chips.

10. The wire bonding apparatus of claim 1, wherein the chip heating unit is configured to supply heat wind having the second heat to upper portions of the plurality of chips.

11. The wire bonding apparatus of claim 1, wherein the chip heating unit is configured to supply infrared rays having the second heat to upper portions of the plurality of chips.

12. A wire bonding apparatus comprising:
a heater block configured to support a stack including a chip mounting frame and a plurality of chips stacked on the chip mounting frame, wherein the heater block is configured to supply heat to a first portion of the stack;
a chip heating unit disposed at a different height from the heater block, wherein the chip heating unit is configured to supply heat to a second portion of the stack at a different height from the first portion;
a first temperature sensing unit positioned to be located at a first height and to determine a first temperature at the first portion of the stack;
a second temperature sensing unit positioned to be located at a second height and to determine a second temperature at the second portion of the stack;
a temperature adjusting unit configured to compare the first temperature to the second temperature and to adjust the magnitude of the heat supplied by at least one of the heater block and the chip heating unit according to a result of the comparison; and
a capillary configured to connect bonding wires to chip pads of the chips.

13. The wire bonding apparatus of claim 12, wherein:
the first portion of the stack is a portion that includes the chip mounting frame and a lower set of chips; and
the second portion of the stack is a portion that includes an upper set of chips.

14. The wire bonding apparatus of claim 13, wherein:
the heater block is disposed below the stack and the chip heating unit is disposed above the stack;
the second height is a height above the top of the stack; and
the first height is a height closer to the bottom of the stack than the second height.

15. The wire bonding apparatus of claim 14, wherein:
the first height is a height below the bottom of the stack.

16. The wire bonding apparatus of claim 12, wherein:
the temperature adjusting unit is configured to adjust the heat supplied by the chip heating unit based on a result of the comparison.

17. The wire bonding apparatus of claim 16, wherein the temperature adjusting unit is configured to compare a temperature difference between the first temperature and the second temperature with a reference value, and increase the magnitude of the heat supplied by the chip heating unit when the temperature difference is greater than the reference value, or maintain the magnitude of the heat supplied by the chip heating unit when the temperature difference is equal to or smaller than the reference value.

18. The wire bonding apparatus of claim 12, further comprising a temperature determining unit configured to determine an initial heat initially to generate by the chip heating unit according to the number of the plurality of chips stacked on the chip mounting frame.

19. The wire bonding apparatus of claim 12, wherein:
the first temperature sensing unit is a sensor configured to sense a temperature of a lower chip in the stack of chips or of the heater block; and
the second temperature sensing unit is a sensor configured to sense a temperature of an upper chip in the stack of chips higher in the stack than the lower chip.

20. A wire bonding apparatus comprising:
a heater block on which a chip mounting frame having a plurality of chips stacked thereon is to be disposed and that is configured to supply first heat to heat lower portions of the plurality of chips;
a chip heating unit disposed above the chip mounting frame and configured to supply second heat to heat upper portions of the plurality of chips;
a first temperature sensing unit configured to sense a first temperature of the heater block;
a second temperature sensing unit configured to sense a second temperature of a first side of the topmost chip among the plurality of chips, is the topmost chip disposed farthest from the heater block;
a third temperature sensing unit configured to sense a third temperature from a second side of the topmost chip; and
a temperature adjusting unit configured to compare an average temperature of the second temperature and the third temperature with the first temperature, and adjust the magnitude of the second heat generated by the chip heating unit according to the comparison result.

21. The wire bonding apparatus of claim 20, wherein the plurality of chips include chips stacked vertically, wherein adjacent chips of the stack are connected to each other by an adhesive layer.

22. The wire bonding apparatus of claim 20, wherein the temperature adjusting unit is configured to compare the first temperature with a first reference temperature and in response, adjust the magnitude of the first heat generated by the heater block.

23. The wire bonding apparatus of claim 20, wherein the temperature adjusting unit is configured to compare a temperature difference between the first temperature and the average temperature with a reference value, and increase the magnitude of the second heat when the temperature difference is greater than the reference value, or maintain the magnitude of the second heat when the temperature difference is equal to or smaller than the reference value.

24. The wire bonding apparatus of claim 20, further comprising a temperature determining unit configured to determine an initial second heat initially generated by the chip heating unit according to the number of the plurality of chips stacked on the chip mounting frame.

25. The wire bonding apparatus of claim 20, further comprising:
a product information supply unit is disposed on the chip mounting frame and configured to supply information on characteristics of the plurality of chips; and
a product recognizing unit configured to recognize characteristics of the plurality of chips from the product information supply unit when the chip mounting frame moves into the wire bonding apparatus,
wherein the chip mounting frame further comprises a temperature determining unit configured to determine an initial second heat initially generated by the chip heating unit according to the characteristics of the plurality of chips recognized by the product recognizing unit.

26. The wire bonding apparatus of claim 25, wherein the plurality of chips includes a bottommost chip disposed closest to the heater block, and the characteristics of the plurality of chips include a heat transfer rate of the first heat from the bottommost chip to the topmost chip.

27. The wire bonding apparatus of claim 20, wherein the temperature adjusting unit is configured to adjust the magnitude of the second heat to reduce a temperature difference between the bottommost chip and the topmost chip.

* * * * *